Feb. 9, 1965 L. M. KRUGMAN ETAL 3,169,222

DOUBLE-EMITTER TRANSISTOR CIRCUITS

Filed Dec. 30, 1960

INVENTORS
LEONARD M. KRUGMAN &
BY ROBERT C. GRAHAM

Eugene M. Whitacre

ATTORNEY

United States Patent Office 3,169,222

Patented Feb. 9, 1965

3,169,222

DOUBLE-EMITTER TRANSISTOR CIRCUITS

Leonard M. Krugman, Haddonfield, N.J., and Robert C. Graham, Indianapolis, Ind., assignors to Radio Corporation of America, a corporation of Delaware Filed Dec. 30, 1960, Ser. No. 79,850
10 Claims. (Cl. 325—319)

This invention relates to transistor circuits and more particularly to transistor circuits utilizing a double-emitter transistor as the active element thereof.

To handle the maximum signal amplitude to be amplified, Class A transistor power amplifiers are designed to draw a relatively large average D.C. current flow so that the transistor operating point is at about the center of the most linear portion of its characteristic. The average D.C. current flowing in the transistor is substantially the same for no signals or small signals as it is for large signals. The current drawn by the Class A power amplifier stage is often a relatively large percentage of that drawn by the apparatus in which the amplifier stage is incorporated. Hence, in the stand-by condition, and also in the low-signal conditions, the current drain is severe enough so that battery operated apparatus, such as portable transistor receivers, generally do not use Class A power amplifiers.

In an attempt to overcome this problem, various biasing and switching techniques have been suggested for regulating the current drain of a Class A amplifier in accordance with the signal level to be amplified. In general these techniques have proved unsatisfactory and have failed to find widespread use in commercial apparatus.

Accordingly, it is an object of this invention to provide an improved transistor amplifier circuit.

It is another object of this invention to provide an improved transistor power amplifier circuit wherein the average D.C. current drain is a function of the level of the signal to be amplified.

It is another object of this invention to provide an improved transistor amplifier circuit wherein a low D.C. current flows in the absence of received signals.

It is a further object of this invention to provide an improved Class A transistor power amplifier circuit for battery operated apparatus which has very low current drain on the battery.

A circuit in accordance with the invention includes a transistor having the following electrodes: a first emitter, a second emitter, a base and a collector. The first emitter, collector and base are connected to operate as an amplifier. An impedance element which is in the second emitter-to-collector current path is also connected between the base and first emitter, so that the second emitter current controls the first emitter-to-base bias. By thus controlling the first emitter-to-base bias, the operating point of the amplifier portion of the circuit may be controlled.

In one embodiment of the invention, the amplifier portion of the transistor is operated as a Class A power amplifier, and the control bias on the second emitter is controlled as a function of the level of the signals to be amplified. The control bias may, for example, be derived from the AGC voltage line or the volume control setting, or both. For very small signals the average D.C. current through the transistor is a minimum, and the D.C. current increases as the signal level increases.

The novel features which are considered to be characteristic of this invention are set forth with particularity in the appended claims. This invention itself however both as to organization and method of operation, as well as additional objects and advantages thereof, will best be understood from the following description when read in connection with the accompanying drawing in which:

Figures 1, 2, 3:
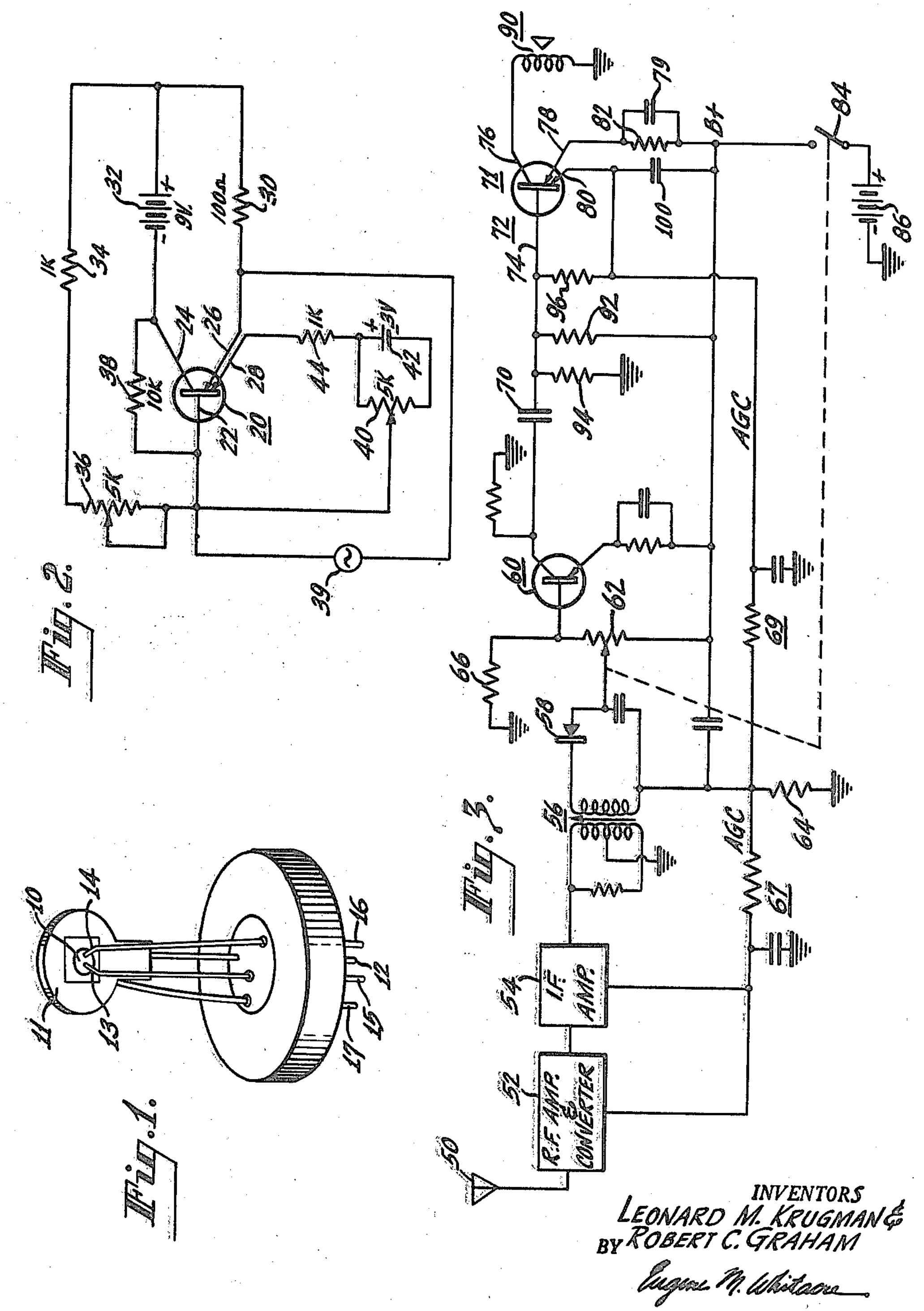
FIGURE 1 is an enlarged perspective view of a double emitter transistor which may be used in circuits embodying the invention.
FIGURE 2 is a schematic circuit diagram of a semiconductor circuit constructed in accordance with the invention; and, FIGURE 3 is a schematic circuit diagram of a radio broadcast receiver embodying the invention.

FIGURE 1 illustrates a double emitter transistor device of the type which may be used in circuits embodying the invention. The device, which is normally encapsulated, includes a base 10 which is conductively connected to a conductive mounting structure 11 supported on an externally accessible connecting lead 12. A first emitter 13 and a second emitter 14 are alloyed onto one side of the base 10 and a collector, not shown, is alloyed onto the opposite side of the base. The first and second emitters 13 and 14 and the collector are accessible externally by means of the connecting leads 15, 16 and 17 respectively.

The base 10 includes a diffused n-type region with varying impurity concentration. The impurity distribution is a maximum at the emitter junctions and decreases toward the collector junction in a substantially exponential manner. The collector periphery encompasses the two emitters and thus assures the collection of carriers injected from either emitter. To prevent interaction in the transistor between the circuits connected to the two emitters which could be caused by the low resistance of the maximum impurity region near the emitters, portions of the area between the two emitters are etched through to a less concentrated impurity region of higher resistivity.

Referring to FIGURE 2, a semiconductor circuit constructed in accordance with the invention includes a transistor device 20 having, as electrodes, a base 22, a collector 24 and first and second emitters 26 and 28 respectively. The first emitter 26 is direct current conductively connected to the collector 24 through the series combination of a load resistor 30 and a source of energizing potential, such as a battery 32. The negative terminal of the battery 32 is connected directly to the collector 24 while the positive terminal is connected through the resistor 30 to the first emitter 26.

A voltage-divider network, including the series combination of a resistor 34, a variable resistance device 36 and a resistor 38 provides the biasing circuit for the transistor 20. The resistors 34 and 36 are connected in series between the positive terminal of the battery 32 and the base 22, while the resistor 38 is connected between the base 22 and the negative terminal of the battery 32.

The aforementioned voltage-divider network and direct-current conductive path between the first emitter 26 and collector 24 comprise the amplifier portion of the circuit. Signals to be amplified are derived from a signal source 39 connected between the first emitter 26 and the base 22 of the transistor 20.

The circuit including the second emitter 28 includes a potentiometer 40 connected across the terminals of a source of biasing potential, such as a battery 42. The adjustable arm of the potentiometer 40 is connected directly to the base 22 of the transistor 20, and a resistor 44 is connected between the positive terminal of the battery 42 and the second emitter 28 to complete the biasing circuit path.

It has been found that the forward biasing voltage between the second emitter 28 and the base 22 in the circuit of FIGURE 2 will control the average D.C. current through the first emitter 26 and the load resistor 30.

When the adjustable arm of the potentiometer 40 is in an extreme position in the direction of the positive terminal of the battery 42, substantially no forward bias will be developed between the second emitter electrode 28 and the base electrode 22 and substantially no current will flow across the junction between the two electrodes.

In this position, the second emitter 28 circuit will have little or no effect on the D.C. current flowing in first emitter 26-collector 24 conductive path. The magnitude of the average D.C. current in this path will be largely determined by the voltage divider biasing circuit and particularly by the ohmic relationship of the resistors 34 and 36 to the resistor 38. The variable resistor 36 is adjusted so that a relatively small voltage is developed across the series combination of resistors 34 and 36, or the first emitter 26-base 22 junction. Consequently, for no-signal or small-signal operation, the transistor 20 will be operating with a low D.C. current and there will be a corresponding low current drain on the battery 32.

As the adjustable arm of the potentiometer 40 is moved toward the negative terminal of the battery 42, the forward bias voltage between the second emitter 28-base 22 junction will increase. Current conduction will therefore occur across this junction. Collector current due to the second emitter electrode 28 flows back to the second emitter 28 in a conductive path including the battery 32 and the series resistors 34 and 36. The increased current in the resistors 34 and 36, which are connected between the base 22 and the first emitter electrode 26, causes an increased voltage drop which is in a direction to increase the forward bias on the first emitter 26-base 22 junction. Consequently the D.C. current flowing between the first emitter 26 and collector 24 will increase to move the operating point of the transistor 20 sufficiently to accommodate larger signal swings without distortion. Representative values of the circuit components are shown in FIGURE 2.

Thus in accordance with the invention, a double emitter transistor circuit may be biased to exhibit a first low D.C. current between one emitter and the collector of the transistor. The first low D.C. current may then be increased to a higher D.C. current by increasing the forward bias of the second emitter electrode with respect to the base electrode.

FIGURE 3 is a schematic circuit diagram of a radio broadcast receiver embodying the invention and which incorporates a Class A audio output stage. Modulated RF (radio frequency) signals, intercepted by an antenna 50, are amplified and converted to an intermediate frequency by an amplifier and converter stage 52. The intermediate frequency is amplified by an IF amplifier 54 and applied through a transformer 56 to a diode detector 58. Detected audio signals from the diode 58 are applied to an audio amplifier 60 by means of an adjustable volume control potentiometer 62.

An AGC (automatic gain control) voltage is also derived from the diode detector 58 across a resistor 64. The AGC voltage varies with the average signal level, and with the setting of the tap on the volume control potentiometer 62. It will be noted that the resistance of the potentiometer 62 and a resistor 66 are connected in series between the +B bus line and ground, and that the positive voltage on the resistor 62 provides a forward bias for the diode 58. The AGC voltage is applied through a filter 67 to control the gain of the IF and RF amplifiers, and is also applied through a filter 69 to a second emitter electrode 80 of a double-emitter transistor 72 for reasons to be explained.

Amplified audio signals from the amplifier 60 are applied through a coupling capacitor 70 to an audio output stage 71. The audio output stage 71 includes the transistor 72 having a base 74, a collector 76 and first and second emitters, 78 and 80 respectively. The first emitter 78, which is bypassed for audio frequency signals by a capacitor 79, is connected through a biasing resistor 82 and a receiver on-off switch 84 to the poistive terminal of an energizing battery 86, the negative terminal of which is grounded. As is indicated in the drawing the switch 84 is ganged for operation at one extreme setting of the volume control potentiometer 62. The collector 76 is connected through the voice coil of a loudspeaker 90 to ground. The base biasing voltage for the power transistor 72 is provided at the junction of a pair of resistors 92 and 94 which are connected in series across the battery terminals. The second emitter 80 is connected to the base 74 by means of a resistor 96, and is bypassed to the B+ operating potential bus line through a bypass capacitor 100.

When the receiver is energized by closing the switch 84, and no signal is being received, the D.C. current drain on the battery is a minimum. The amplifier stages 52, 54 and 60 draw about the same current as corresponding stages of existing receivers. The relationship of the various components biasing the transistor 72 are selected so that the total D.C. current drawn thereby is very small, and may, for example, be comparable to that drawn by commercially acceptable push-pull amplifier stages.

In the example shown, the amplifier portion of the transistor 72 is biased to a point on its characteristic where very small signals may be amplified without distortion. Increases in signal amplitude which may be occasioned by moving the slider on the potentiometer 62 closer to the base of the transistor 60, or increases in the average signal level, would, at this operating point, cause distortion by driving the transistor into cut-or on alternate half cycles of the signal wave excursions. Such changes in potentiometer 62 setting or in signal level, however, increase the positive voltage developed on the AGC bus which is connected to the second emitter 80 of the transistor 72. The positive AGC voltage is of a magnitude to forward bias the emitter 80-base 74 junction, and permits conduction from the second emitter 80 to the collector 76. The D.C. circuit for the second emitter 80-collector 76 current includes the loudspeaker 90 voice coil, the battery 86, the switch 84, and the resistors 92 and 96. The second emitter 80 current flow in the resistor 92 is in a direction to cause an increased forward bias to be developed for the first emitter 78-base 74 junction. The increased forward bias increases the D.C. conduction in the first emitter 78-collector 76 output circuit to the minimum value consistent with linear amplification of the signals applied to the base 74.

Standby D.C. current in the transistor Class A audio output stage is thus kept to a minimum value consistent with linear amplification of the signals to be amplified. This reduces the drain on the energizing potential source of the receiver thereby extending the useful life thereof.

What is claimed is:

1. In an amplifier, a transistor having a first and a second emitter electrode, a base electrode and a collector electrode, a potentiometer having a slider, means for applying a direct current potential across said potentiometer and to said slider, means for applying a signal across said potentiometer, means for applying the signal applied across said potentiometer between the base and the first emitter of said transistor, means for applying the direct current potential applied to said slider to said second emitter, and an output means coupled between said collector and said first emitter.

2. In an amplifier, a transistor having a first and a second emitter electrode, a base electrode and a collector electrode, detection means for deriving signal modulation from a carrier-wave, and a potentiometer having a slider, means for applying a direct current potential across said potentiometer and to said slider, means for applying the signal modulation derived by said detector to said slider and to said potentiometer, means for applying the signal applied across said potentiometer between the base and the first emitter of said first transistor, and means for applying the direct current potential applied to said slider to said second emitter, and an output means coupled between said collector and said first emitter.

3. A semiconductor circuit comprising in combination a transistor having a first emitter electrode, a second emitter electrode, a base electrode and a collector electrode; an impedance element connected between said first emitter and base electrodes for developing a bias there-between; means including said impedance element for connecting said first emitter, base and collector electrodes in an amplifier circuit configuration; means including said impedance element for direct current conductively connecting said collector electrode to said second emitter electrode; and control circuit means coupled to said second emitter electrode for controlling the magnitude of second emitter electrode current whereby a bias is developed across said impedance element to control the magnitude of current in said first emitter electrode.

4. In an amplifier, a carrier-wave amplifier, a transistor having a first and a second emitter electrode and a base electrode and a collector electrode, detection means for deriving signal modulation and automatic gain control voltage from said carrier-wave amplifier, a potentiometer having a slider, means for applying a direct current potential across said potentiometer and to said slider, means for applying the signal modulation derived by said detector to said slider and to said potentiometer, means for applying the signal applied across said potentiometer between the base and the first emitter of transistor, means for applying direct current potential applied to said slider to said second emitter, means for applying said automatic gain control voltage to said carrier-wave amplifier, and an output means coupled between said collector and said first emitter.

5. In an amplifier, a transistor having first, second emitter electrodes, a base electrode and a collector electrode, an output circuit for said transistor comprising an output impedance and means for applying operating voltage in a series path between said first emitter and said collector, an input circuit for said transistor including a biasing means connected between said base and said first emitter, means for connecting said second emitter to a point on said input circuit, a potentiometer having a slider and means applying biasing potential across said potentiomter and to said slider, means for applying signals to said input circuit including said potentiometer and means for direct current conductively connecting said slider to said second emitter.

6. A semiconductor circuit comprising in combination a transistor having a first emitter electrode, a second emitter electrode, a base electrode and a collector electrode, an output circuit connected between said first emitter and said collector electrodes and adapted to receive a source of energizing potential, an input circuit including a first resistor connected between said first emitter and said base electrodes, and a control circuit including a second resistor connected between said second emitter and said base electrodes, said control circuit adapted to receive a control voltage for controlling the average D.C. current through said first resistor, thereby controlling the quiescent operating current in said output circuit connected between said first emitter and collector.

7. A semiconductor circuit comprising in combination a transistor having a first emitter electrode, a second emitter electrode, a base electrode and a collector electrode, an output circuit connected between said first emitter and said collector electrodes and adapted to receive a source of energizing potential, a biasing circuit including a resistor connected between said first emitter and said base electrodes and a resistor connected between said base and said collector electrodes, and a control circuit including a resistor connected between said second emitter electrode and said base electrode, said control circuit adapted to receive a control voltage for controlling the quiescent operating D.C. current through said transistor.

8. An amplifier circuit comprising in combination a transistor having a first emitter electrode, a second emitter electrode, a base electrode and a collector electrode, signal output means connected between said first emitter and said collector electrodes and adapted to receive a source of energizing potential, signal input means including a resistor connected between said first emitter and said base electrodes, and a control circuit including a resistor connected between said second emitter and said base electrodes, said control circuit adapted to receive a control voltage for biasing said second emitter electrode with respect to said base electrode to provide second emitter electrode current, said input circuit resistor providing a direct current conductive connection from said collector electrode through said signal output means to said second emitter electrode whereby said control voltage controls the bias of said first emitter electrode with respect to said base electrode by controlling the current through said input circuit resistor.

9. In a radio receiver of the type including an antenna for intercepting signal modulated R.F. waves, a frequency converter for converting said radio frequency waves to intermediate frequency waves, means for amplifying said intermediate frequency waves, detection means for deriving the signal modulation from the intermediate frequency waves, automatic gain control means derived from said detector means for limiting the gain of said receiver and an audio amplifier for amplifying said detected signals, the combination comprising a transistor having a first emitter electrode, a second emitter electrode, a base electrode and a collector electrode, means coupling said audio amplifier to said base electrode, signal output means connected between said collector electrode and said first emitter electrode, said signal output means adapted to receive a source of energizing potential, signal input means including a resistor connected from said base electrode to said first emitter electrode, and circuit means including a resistor connected between said second emitter electrode and said base electrode, said circuit means coupled to said automatic gain control means for deriving a control voltage as a function of signal level to control the current in said transistor.

10. A semiconductor circuit comprising a transistor adapted to be connected to a source of energizing potential and having first and second emitter electrodes, a base electrode and a collector electrode; a biasing resistor connected between said first emitter and collector electrodes; and biasing means whereby an increased current flow between said second emitter and collector electrodes flows through said biasing resistor to develop a bias for increasing the current flow between said first emitter and said collector electrodes, said biasing means including said biasing resistor to provide a direct current connection between said second emitter and said collector electrodes.

References Cited in the file of this patent

UNITED STATES PATENTS

| | | |
|---|---|---|
| 2,476,323 | Rack | July 19, 1949 |
| 2,701,281 | White et al. | Feb. 1, 1955 |
| 2,801,347 | Dodge | July 30, 1957 |
| 2,867,733 | Hunter | Jan. 6, 1959 |
| 2,915,602 | Maupin | Dec. 1, 1959 |
| 2,994,810 | Gadmundsen | Aug. 1, 1961 |
| 2,997,578 | Englund | Aug. 22, 1961 |
| 3,029,340 | Englund | Apr. 10, 1962 |
| 3,080,529 | Schultz et al. | Mar. 5, 1963 |